(12) United States Patent
Cheng et al.

(10) Patent No.: US 11,782,622 B2
(45) Date of Patent: Oct. 10, 2023

(54) MEMORY APPARATUS EMBEDDED WITH COMPUTING FUNCTION AND OPERATION METHOD THEREOF

(71) Applicant: Winbond Electronics Corp., Taichung (TW)

(72) Inventors: Wu-Chuan Cheng, Taichung (TW); Chien-Ti Hou, Taichung (TW)

(73) Assignee: Winbond Electronics Corp., Taichung (TW)

( * ) Notice: Subject to any disclaimer, the term of this patent is extended or adjusted under 35 U.S.C. 154(b) by 27 days.

(21) Appl. No.: 17/584,344

(22) Filed: Jan. 25, 2022

(65) Prior Publication Data
US 2022/0236874 A1 Jul. 28, 2022

(30) Foreign Application Priority Data
Jan. 28, 2021 (TW) ................................ 110103328

(51) Int. Cl.
*G06F 13/16* (2006.01)
*G06F 3/06* (2006.01)

(52) U.S. Cl.
CPC ............ *G06F 3/064* (2013.01); *G06F 3/0613* (2013.01); *G06F 3/0671* (2013.01); *G06F 13/1668* (2013.01)

(58) Field of Classification Search
CPC .... G06F 3/064; G06F 13/1668; G06F 3/0613; G06F 3/0671
USPC ........................................................ 711/154
See application file for complete search history.

(56) References Cited

U.S. PATENT DOCUMENTS

| | | | |
|---|---|---|---|
| 7,505,352 B2 | 3/2009 | Gyoten et al. | |
| 9,658,953 B2 | 5/2017 | Sheffler et al. | |
| 9,922,695 B2 | 3/2018 | Tomishima et al. | |
| 10,607,679 B2 * | 3/2020 | Nakaoka ........... | G11C 11/40618 |

(Continued)

FOREIGN PATENT DOCUMENTS

| | | |
|---|---|---|
| TW | 200614240 | 5/2006 |
| TW | I595413 | 8/2017 |
| TW | I680458 | 12/2019 |

OTHER PUBLICATIONS

"Office Action of Taiwan Counterpart Application", dated Jan. 14, 2022, p. 1-p. 10.

*Primary Examiner* — Christopher B Shin
(74) *Attorney, Agent, or Firm* — JCIPRNET

(57) ABSTRACT

A memory apparatus embedded with a computing function and an operation method thereof are provided. The memory apparatus includes a memory array, a plurality of data flow controllers, a plurality of computation circuits, a data bus, and a control logic circuit. The memory array includes a plurality of block groups having a plurality of memory blocks. Each of the data flow controllers selects a transmission path of data of each memory block according to a corresponding one of the data flow control signals. In a computation mode, the computation circuit computes first data from the corresponding memory block. In a normal mode, second data is transmitted between the data bus and the corresponding memory block. The data flow controller transmits the first data from the corresponding memory block to the computation circuit according to the data flow control signal provided by the control logic circuit to compute the first data.

19 Claims, 8 Drawing Sheets

(56) References Cited

U.S. PATENT DOCUMENTS

| | | | |
|---|---|---|---|
| 11,016,810 B1* | 5/2021 | Parikh | G06N 3/0454 |
| 11,091,376 B2* | 8/2021 | Ohnari | C02F 1/48 |
| 11,157,213 B2* | 10/2021 | Golov | G06N 3/06 |
| 11,221,827 B1* | 1/2022 | Hsu | G06N 3/063 |
| 11,501,149 B2* | 11/2022 | Kwak | G06N 3/063 |
| 2008/0168013 A1* | 7/2008 | Cadaret | G06K 9/6273 |
| | | | 706/20 |
| 2014/0115195 A1* | 4/2014 | Higham | G06F 13/28 |
| | | | 710/22 |
| 2015/0242334 A1* | 8/2015 | Higham | G06F 13/1668 |
| | | | 711/163 |
| 2016/0028695 A1 | 1/2016 | Binder | |
| 2017/0147228 A1* | 5/2017 | Yudanov | G06F 13/4022 |
| 2018/0188973 A1* | 7/2018 | Cargnini | G11C 16/24 |
| 2019/0042251 A1* | 2/2019 | Nurvitadhi | G06F 15/7821 |
| 2019/0172521 A1 | 6/2019 | Morgan | |
| 2020/0117400 A1* | 4/2020 | Golov | G06F 3/0604 |

* cited by examiner

MEMORY APPARATUS EMBEDDED WITH COMPUTING FUNCTION AND OPERATION METHOD THEREOF

CROSS-REFERENCE TO RELATED APPLICATION

This application claims the priority benefit of Taiwan application serial no. 110103328, filed on Jan. 28, 2021. The entirety of the above-mentioned patent application is hereby incorporated by reference herein and made a part of this specification.

BACKGROUND

Technical Field

The disclosure relates to a memory architecture, and more particularly to a memory apparatus and an operation method thereof capable of computing data inside the memory apparatus.

Description of Related Art

With the advancement of science and technology, various digital product innovations have been continuously introduced. With the convenience it brings to people, the amount of data calculations that need to be processed also increases. For example, the application range of AI operations has become wider and wider, including neural network operations such as image analysis, voice analysis, and natural language processing through neural network models. Regardless of the algorithm used in a neural network operation, to carry out the function of machine learning, the number of parameters processed is usually enormous. Therefore, a huge amount of data transferred back and forth between the processing chip and the memory apparatus (e.g., a dynamic random access memory (DRAM)) has become a bottleneck that is difficult for various algorithms to break through in improving computing speed and reducing energy consumption.

SUMMARY

The disclosure provides a memory apparatus embedded with a computing function and an operation method thereof, capable of directly computing data parallelly in the memory apparatus through an embedded computation circuit to improve the computing speed and reduce energy consumption. Accordingly, the memory apparatus and the operation method thereof provided in the disclosure contribute to the field of AI operations.

The disclosure provides a memory apparatus embedded with a computing function. The memory apparatus includes a memory array, multiple data flow controllers, multiple computation circuits, a data bus, and a control logic circuit. The memory array includes multiple block groups. Each of the block groups includes multiple memory blocks. The data flow controllers respectively are coupled to the block groups. The data flow controllers respectively select a transmission path of data of each of the memory blocks in the block groups according to data flow control signals. The computation circuits respectively are coupled to the data flow controllers. In a computation mode, the computation circuit computes first data from the corresponding memory block. The data bus is coupled to the data flow controllers. In a normal mode, second data is transmitted between the data bus and the corresponding memory block. The control logic circuit is coupled to the memory array, the data flow controllers, and the computation circuits. The control logic circuit determines whether currently it is the normal mode or the computation mode, and accordingly provides the data flow controller with the data flow control signal. The data flow controller transmits the first data from the corresponding memory block to the corresponding computation circuit for computing the first data according the data flow control signal.

The operation method in the disclosure is adapted for a memory apparatus embedded with multiple block groups and multiple computation circuits. Each of the block groups includes multiple memory blocks. The operation method includes the following steps: determining whether currently it is a normal mode or a computation mode, and accordingly providing multiple data flow control signals; selecting the transmission path of the data of each of the memory blocks in the block groups respectively according to the data flow control signals; transmitting the first data from the corresponding memory block to the corresponding computation circuit to compute the first data from the corresponding memory block in the computation mode according to the data flow control signal; and transmitting the second data in the normal mode along with the corresponding memory block.

In order to make the aforementioned features and advantages of the disclosure comprehensible, embodiments accompanied with drawings are described in detail below.

DESCRIPTION OF THE EMBODIMENTS

Figure 1:
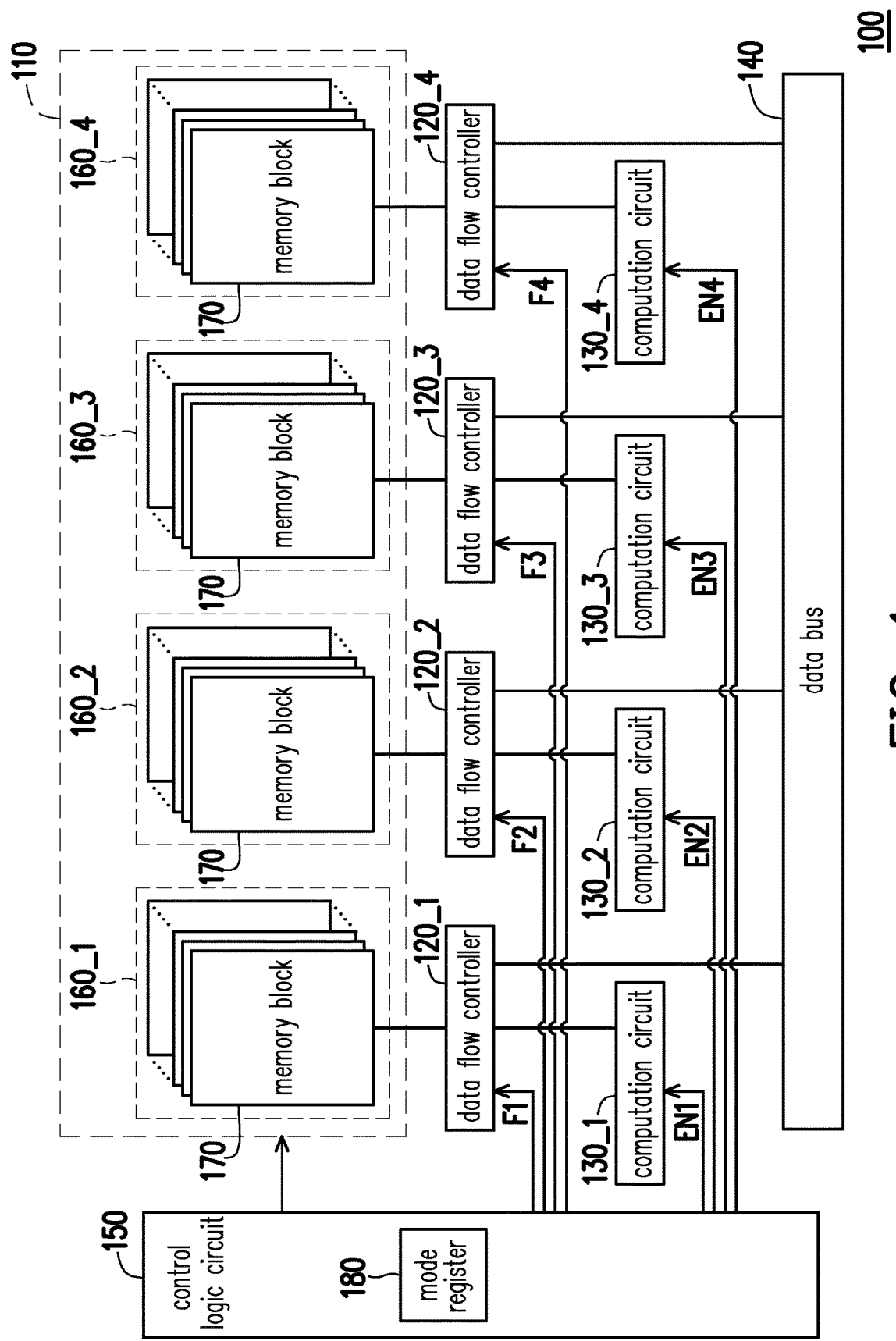
FIG. 1 is a schematic circuit view of a memory apparatus according to an embodiment of the disclosure.

Refer to FIG. 1, a memory apparatus 100 includes a memory array 110, data flow controllers 120_1 to 120_4, computation circuits 130_1 to 130_4, a data bus 140, and a control logic circuit 150. The memory array 110 includes block groups 160_1 to 160_4, and each of the block groups 160_1 to 160_4 includes a plurality of memory blocks 170. Accordingly, the memory apparatus 100 in the disclosure is embedded with a computing function.

Note that four data flow controllers 120_1 to 120_4, four computation circuits 130_1 to 130_4, and four block groups 160_1 to 160_4 included in the memory apparatus 100 are illustrated in the embodiment, but the disclosure is not limited to the number of each of the elements. Those skilled in the art may refer to the teachings of the embodiment according to their actual needs to include the elements in a quantity less or greater than four.

The memory array 110 is adapted to store data. For the convenience of description, in the embodiment, the data transmitted from the memory array 110 to the computation circuits 130_1 to 130_4 for computation in a computation mode is called first data Data1, and the data transmitted between the memory array 110 and the data bus 140 in a normal mode is called second data Data2. In the embodiment, for example, the memory array 110 may include a DRAM, but the disclosure is not limited thereto. In other embodiments, the memory array 110 may include volatile memory elements, such as a static random access memory, or it may include non-volatile memory elements, such as a flash memory, a phase change memory, a resistive memory, and the like.

The data flow controllers 120_1 to 120_4 respectively are coupled to the block groups 160_1 to 160_4. The data flow controllers 120_1 to 120_4 respectively select the transmission path of data of each of the memory blocks 170 in the block groups 160_1 to 160_4 according to data flow control signals F1 to F4 from the control logic circuit 150. The method for selecting the transmission path of data of each of the memory blocks 170 is illustrated in more detail in the subsequent paragraphs.

The computation circuits 130_1 to 130_4 respectively are coupled to the data flow controllers 120_1 to 120_4. Each of the computation circuits 130_1 to 130_4 may include multiple processing units, such as DRAM processing units (DPUs) including a multiply-accumulate (MAC) unit. Each of the computation circuits 130_1 to 130_4 may compute the first data Data1 from the corresponding memory block 170 in the computation mode through the processing unit.

The data bus 140 is coupled to the data flow controllers 120_1 to 120_4, and the second data Data2 is transmitted between the data bus 140 and the corresponding memory block 170 in the normal mode. The memory apparatus 100 may read the second data Data2 from the memory block 170 to an external processing chip or other external elements through the data bus 140, and the second data Data2 may also be written to the memory block 170 from an external processing chip or other external elements through the data bus 140.

The control logic circuit 150 is coupled to the memory array 110, the data flow controllers 120_1 to 120_4, and the computation circuits 130_1 to 130_4. The control logic circuit 150 may determine whether currently it is the normal mode or the computation mode and accordingly provide the data flow controllers 120_1 to 120_4 with the data flow control signals F1 to F4. Specifically, the control logic circuit 150 includes a mode register 180. The control logic circuit 150 may determine whether currently it is the normal mode or the computation mode according to the mode setting code stored in the mode register 180 and provide the data flow control signals F1 to F4 according to the stored mode setting code.

Taking the data flow controller 120_1 as an example, in the computation mode, the data flow controller 120_1 may connect the path with the computation circuit 130_1 and disconnect the path with the data bus 140 according to the data flow control signal F1. Accordingly, the data flow controller 120_1 may transmit the first data Data1 from the memory blocks 170 in the block group 160_1 to the computation circuit 130_1 to compute the first data Data1. In one embodiment, after the computation circuit 130_1 computes the first data Data1, the data flow control signal F1 may control the computation result of the computation circuit 130_1 to be written back to the designated address in the memory array 110.

On the other hand, in the normal mode, the data flow controller 120_1 may also disconnect the path with the computation circuit 130_1 and connect the path with the data bus 140 according to the data flow control signal F1. Accordingly, the data flow controller 120_1 may connect the memory blocks 170 in the block group 160_1 and the data bus 140 to make it possible to transmit the second data Data2 between each other.

In addition, in the embodiment, in the computation mode, the plurality of first data Data1 transmitted between the memory blocks 170 and the computation circuits 130_1 to 130_4 may be transmitted in parallel. Meanwhile, the control logic circuit 150 may provide the computation circuits 130_1 to 130_4 respectively with computation enabling signals EN1 to EN4. The processing unit in each of the computation circuits 130_1 to 130_4 may perform multiply-accumulate operation on the first data Data1 from the corresponding memory block 170 in parallel according to the computation enabling signals EN1 to EN4. Specifically, at the end of the memory block 170, a parallel data interface is adopted to transmit data. In the related art, the memory block needs to transmit the data to be computed to an external processing unit through a data bus, so before the processing unit obtains the data read from the memory block, a parallel to serial conversion must be performed to convert the read data into a serial for transmission to the external processing unit. Similarly, before the computed data output by the external processing unit is written to the memory block, the serial to parallel conversion is performed on the computed data to transmit the computed data to the memory block in parallel. In contrast, in the embodiment, the computation circuits 130_1 to 130_4 respectively are coupled to the block groups 160_1 to 160_4 through the data flow controllers 120_1 to 120_4 rather than through the data bus 140, so the first data Data1 may be directly transmitted in parallel between the processing unit in each of the computation circuits 130_1 to 130_4 and the corresponding memory block 170 without performing any parallel to serial conversion or any serial to parallel conversion. Accordingly, the time on parallel and serial conversion and the time on serial transmission may be saved, and thereby the improvement of computing speed and the reduction of energy consumption may be achieved.

In the embodiment, the mode register 180 may also store block computing codes. The control logic circuit 150 may determine which block group outputs the first data Data1 to the corresponding computation circuit for computation in the computation mode according to the block computing codes. The following Table 1 illustrates the correspondence between the block computing codes and the block groups.

TABLE 1

| Block Computing Code | Block Group |
| --- | --- |
| 0000000 | 160_1 |
| 0000001 | 160_2 |
| 0000010 | 160_3 |
| 0000011 | 160_4 |
| 0000100 | 160_1, 160_2 |
| 0010000 | 160_1, 160_2, and 160_3 |
| 0100000 | 160_1, 160_2, 160_3, and 160_4 |

According to Table 1, when the block computing code is "0000000", it means that the data stored in the memory blocks 170 in the block group 160_1 is computed by the computation circuit 130_1 in the computation mode. When the block computing code is "0000001", it means that the data stored in the memory blocks 170 in the block group 160_2 is computed by the computation circuit 130_2 in the computation mode, and so on.

In addition to only performing computations on multiple pieces of data altogether in a single block group, a mode of performing computations on multiple pieces of data in multiple block groups is provided as well in the embodiment. According to Table 1, when the block computing code is "0000100", it means that the data stored in the memory blocks 170 in the block groups 160_1 and 160_2 is altogether computed through the corresponding computation circuit 130_1 and 130_2, respectively. When the block computing code is "0010000", it means that the data stored in the memory blocks 170 in the block groups 160_1, 160_2, and 160_3 is altogether computed through the corresponding computation circuits 130_1, 130_2, and 130_3 in the computation mode. When the block computing code is "0100000", it means that the data stored in the memory blocks 170 in the block groups 160_1, 160_2, 160_3, and 160_4 is altogether computed through the corresponding computation circuits 130_1, 130_2, 130_3, and 130_4 respectively in the computation mode. Accordingly, the block groups 160_1 to 160_4 in the memory apparatus 100 may simultaneously perform a matrix multiply-accumulate operation, which greatly reduces the time required for computing the data. In the example of computing the data of the four block groups 160_1, 160_2, 160_3, and 160_4 altogether, when the block computing code is "0100000", the time required for computing the data may be reduced to a quarter of the time for computing the four block groups one by one by comparison.

Note that in Table 1 only the correspondence between some specific block computing codes and block groups are illustrated. Those skilled in the art may refer to the teachings of the embodiment according to their actual needs and infer the correspondence between the remaining block computing codes and block groups.

Figure 2:
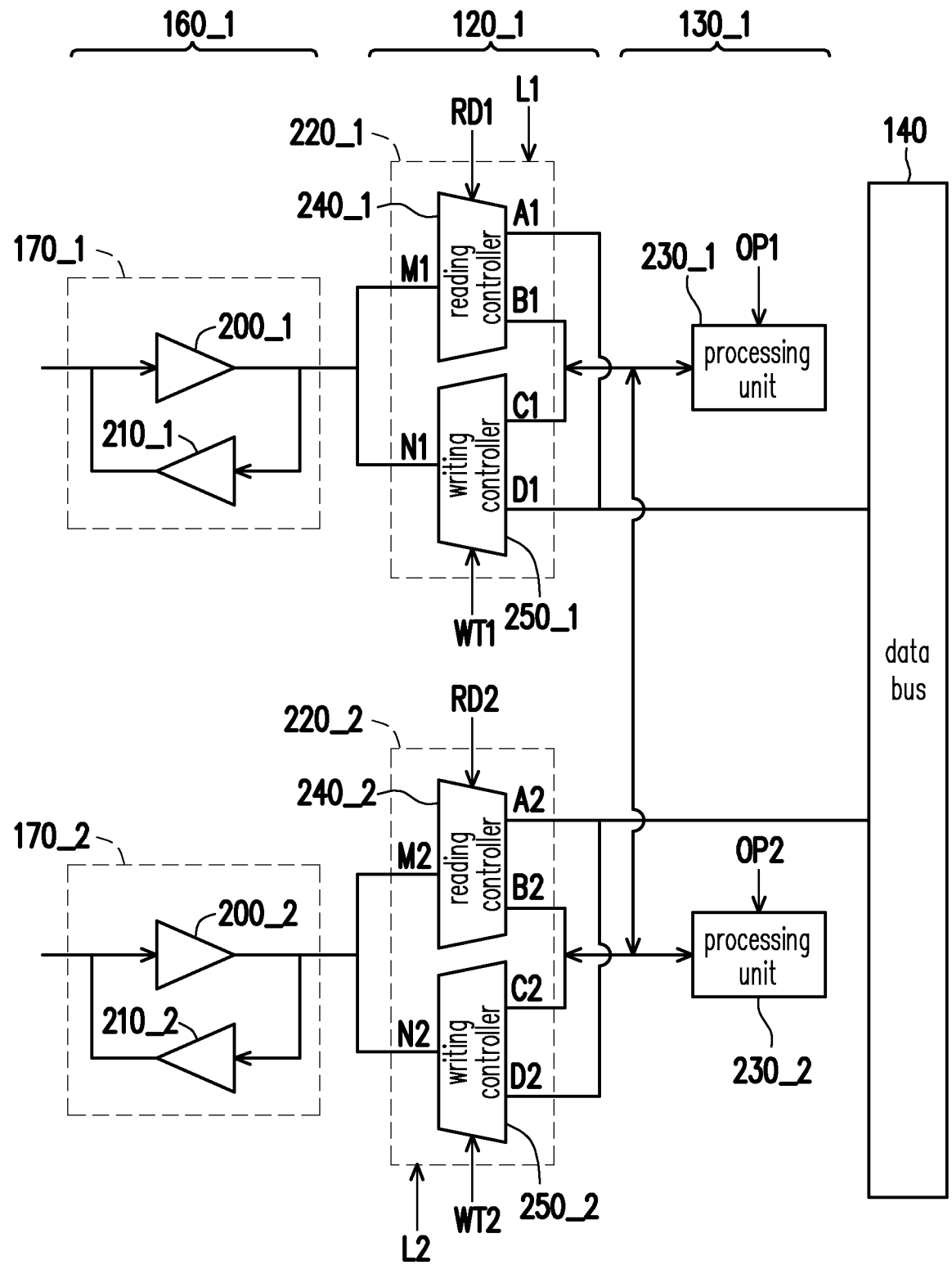
FIG. 2 is a schematic view of a data flow controller according to an embodiment of the disclosure.

FIG. 2 is a schematic view of a data flow controller according to an embodiment of the disclosure. In order to describe the disclosure more specifically, the block group 160_1 is illustrated as an example.

As shown in FIG. 2, the block group 160_1 includes memory blocks 170_1 and 170_2. In addition to a plurality of memory units not shown, the memory block 170_1 also includes a sense amplifier 200_1 and a writing driver 210_1, and the memory block 170_2 also includes a sense amplifier 200_2 and a writing driver 210_2. The sense amplifier 200_1 and the sense amplifier 200_2 are configured to read data from the memory blocks 170_1 and 170_2, respectively. The writing drivers 210_1 and 210_2 are configured to write data to the memory blocks 170_1 and 170_2, respectively.

The data flow controller 120_1 includes path control circuits 220_1 and 220_2. The memory blocks 170_1 and 170_2 respectively are coupled to the path control circuits 220_1 and 220_2. The computation circuit 130_1 includes processing units 230_1 and 230_2. The path control circuit 220_1 is coupled to the processing unit 230_1 and the data bus 140. The path control circuit 220_2 is coupled to the processing unit 230_2 and the data bus 140. In addition, the processing units 230_1 and 230_2 disposed in the computation circuit 130_1 may also be coupled to each other.

As shown in FIG. 2, the path control circuit 220_1 includes a reading controller 240_1 and a writing controller 250_1. An input terminal M1 of the reading controller 240_1 is coupled to the memory block 170_1. An output terminal A1 (a first output terminal) of the reading controller 240_1 is coupled to the data bus 140. An output terminal B1 (a second output terminal) of the reading controller 240_1 is coupled to the processing unit 230_1. An input terminal C1 (a first input terminal) of the writing controller 250_1 is coupled to the processing unit 230_1. An input terminal D1 (a second input terminal) of the writing controller 250_1 is coupled to the data bus 140. An output terminal N1 of the writing controller 250_1 is coupled to the memory block 170_1.

As shown in FIG. 2, the path control circuit 220_2 includes a reading controller 240_2 and a writing controller 250_2. An input terminal M2 of the reading controller 240_2 is coupled to the memory block 170_2. An output terminal A2 (a first output terminal) of the reading controller 240_2 is coupled to the data bus 140. An output terminal B2 (a second output terminal) of the reading controller 240_2 is coupled to the processing unit 230_2. An input terminal C2 (a first input terminal) of the writing controller 250_2 is coupled to the processing unit 230_2. An input terminal D2 (a second input terminal) of the writing controller 250_2 is coupled to the data bus 140. An output terminal N2 of the writing controller 250_2 is coupled to the memory block 170_2. For example, the reading controllers 240_1 and 240_2 and the writing controllers 250_1 and 250_2 may be logic circuits including multiple switches, but the disclosure is not limited thereto.

In the embodiment, the data flow control signal F1 provided by the control logic circuit 150 includes a path control signal L1 and a path control signal L2. The reading controller 240_1 may select the output terminal A1 or the output terminal B1 to output data according to the path control signal L1. The writing controller 250_1 may select the input terminal C1 or the input terminal D1 to obtain the data to be written according to the path control signal L1. The reading controller 240_2 may select the output terminal A2 or the output terminal B2 to output data according to the path control signal L2. The writing controller 250_2 may select the input terminal C2 or the input terminal D2 to obtain the data to be written according to the path control signal L2.

As shown in FIG. 2, in the embodiment, the control logic circuit 150 also provides a reading signal RD1 and a writing signal WT1 to the reading controller 240_1 and the writing controller 240_1 respectively, and provides a reading signal RD2 and a writing signal WT2 to the reading controller 240_2 and the writing controller 240_2 respectively. The following Table 2 illustrates the correspondence between memory blocks and transmission paths.

TABLE 2

| Memory block | Path control signal L1/L2 | Reading signal RD1/RD2 | Writing signal WT1/WT2 | Path selected |
|---|---|---|---|---|
| 170_1 | 0 | 1 | 0 | A1 |
|  | 1 | 1 | 0 | B1 |
|  | 1 | 0 | 1 | C1 |
|  | 0 | 0 | 1 | D1 |
|  | 1 | 1 | 1 | B1 and C1 |
| 170_2 | 0 | 1 | 0 | A2 |
|  | 1 | 1 | 0 | B2 |
|  | 1 | 0 | 1 | C2 |
|  | 0 | 0 | 1 | D2 |
|  | 1 | 1 | 1 | B2 and C2 |

In Table 2, 0 represents a first logic level (e.g., a low logic level), and 1 represents a second logic level (e.g., a high logic level). In addition, the computation enabling signal EN1 provided by the control logic circuit 150 includes an operation enabling signal OP1 and an operation enabling signal OP2. The processing units 230_1 and 230_2 may be enabled to perform corresponding computations according to the operation enabling signal OP1 and the operation enabling signal OP2, respectively.

FIG. 3A to FIG. 3E are schematic views of the operation of the operation method of a memory apparatus according to an embodiment of the disclosure. The operation method of the memory apparatus of the disclosure is illustrated with reference to Table 2.

Figure 3A:
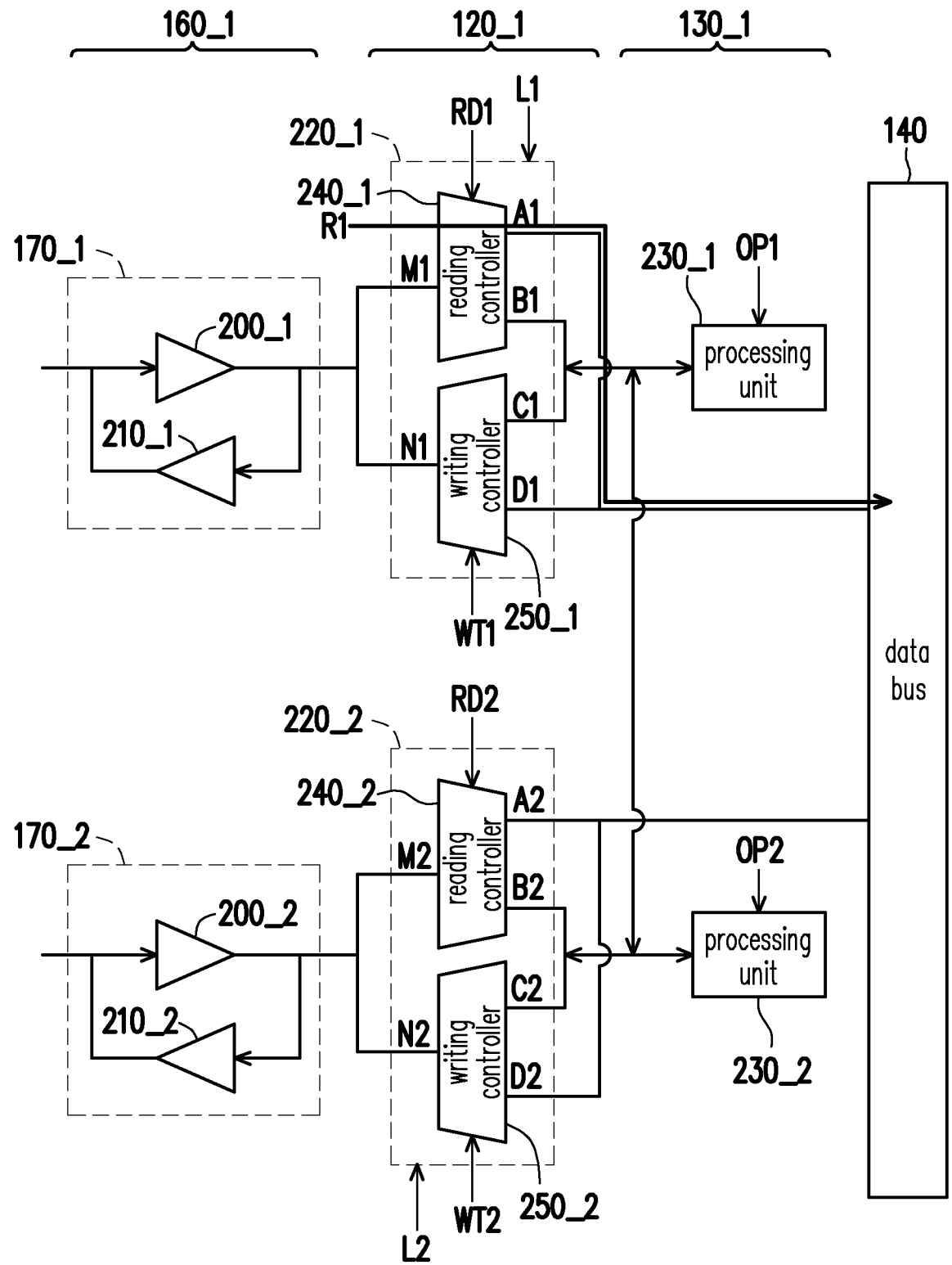
FIG. 3A to FIG. 3E are schematic views of the operation of the operation method of a memory apparatus according to an embodiment of the disclosure.

Referring to FIG. 3A, when the path control circuit 220_1 coupled to the memory block 170_1 receives the path control signal L1 with the first logic level (0), it represents that the memory apparatus is currently in the normal mode. According to Table 2, when the path control circuit 220_1 receives the reading signal RD1 with the second logic level (1) and the writing signal WT1 with the first logic level (0), the reading controller 240_1 selects the output terminal A1 to establish a transmission path R1 of the data of the memory block 170_1 to the data bus 140. Accordingly, the reading controller 240_1 may read the second data Data2 from the memory block 170_1 to the data bus 140 through the transmission path R1.

Figure 3B:
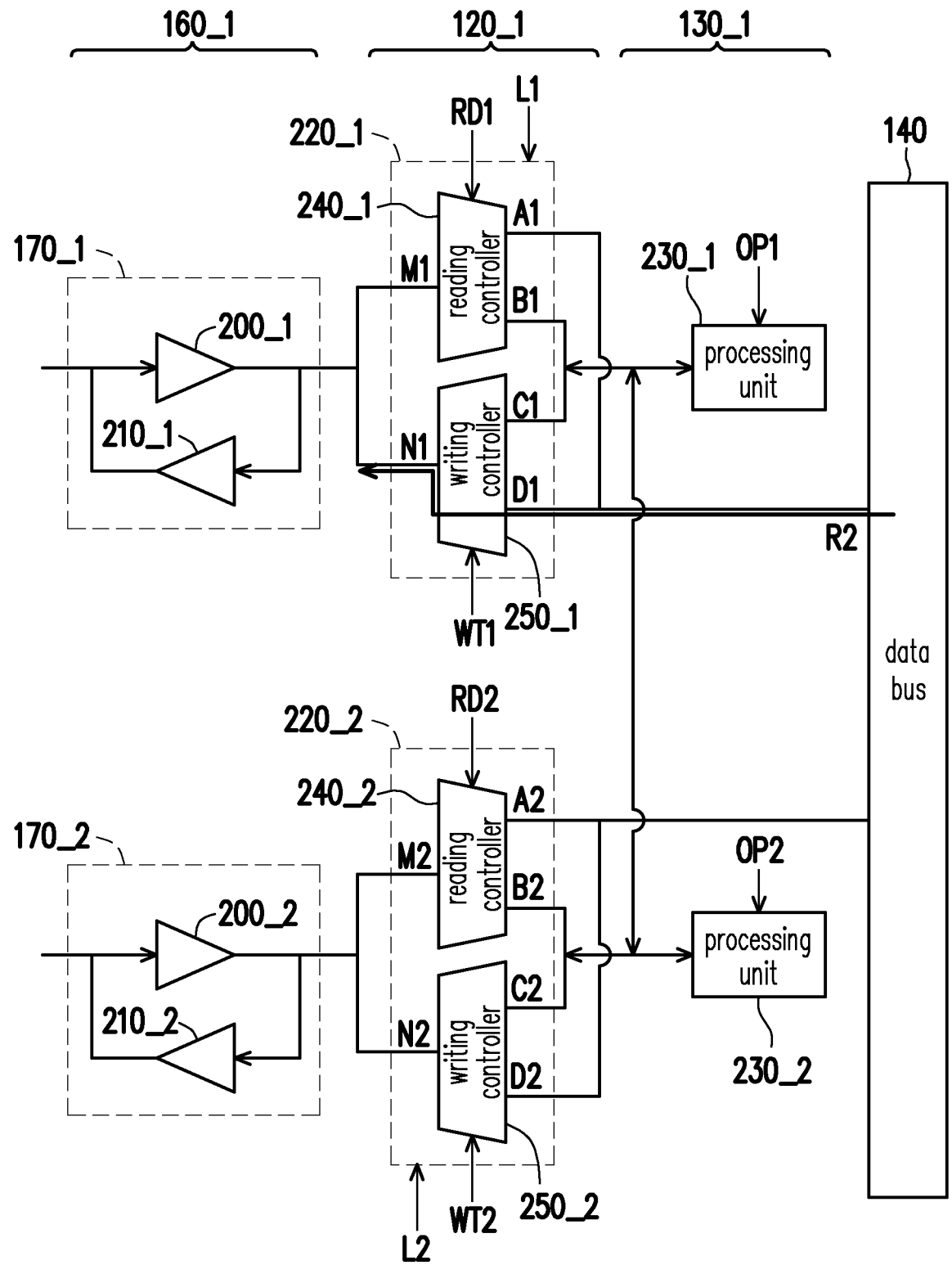

Referring to FIG. 3B, when the path control circuit 220_1 coupled to the memory block 170_1 receives the path control signal L1 with the first logic level (0), it represents that the memory apparatus is currently in the normal mode. According to Table 2, when the path control circuit 220_1 receives the reading signal RD1 with the first logic level (0) and the writing signal WT1 with the second logic level (1), the writing controller 250_1 selects the input terminal D1 to establish a transmission path R2 of the data of the memory block 170_1 from the data bus 140. Accordingly, the writing controller 250_1 may write the second data Data2 from the data bus 140 to the memory block 170_1 through the transmission path R2.

Figure 3C:
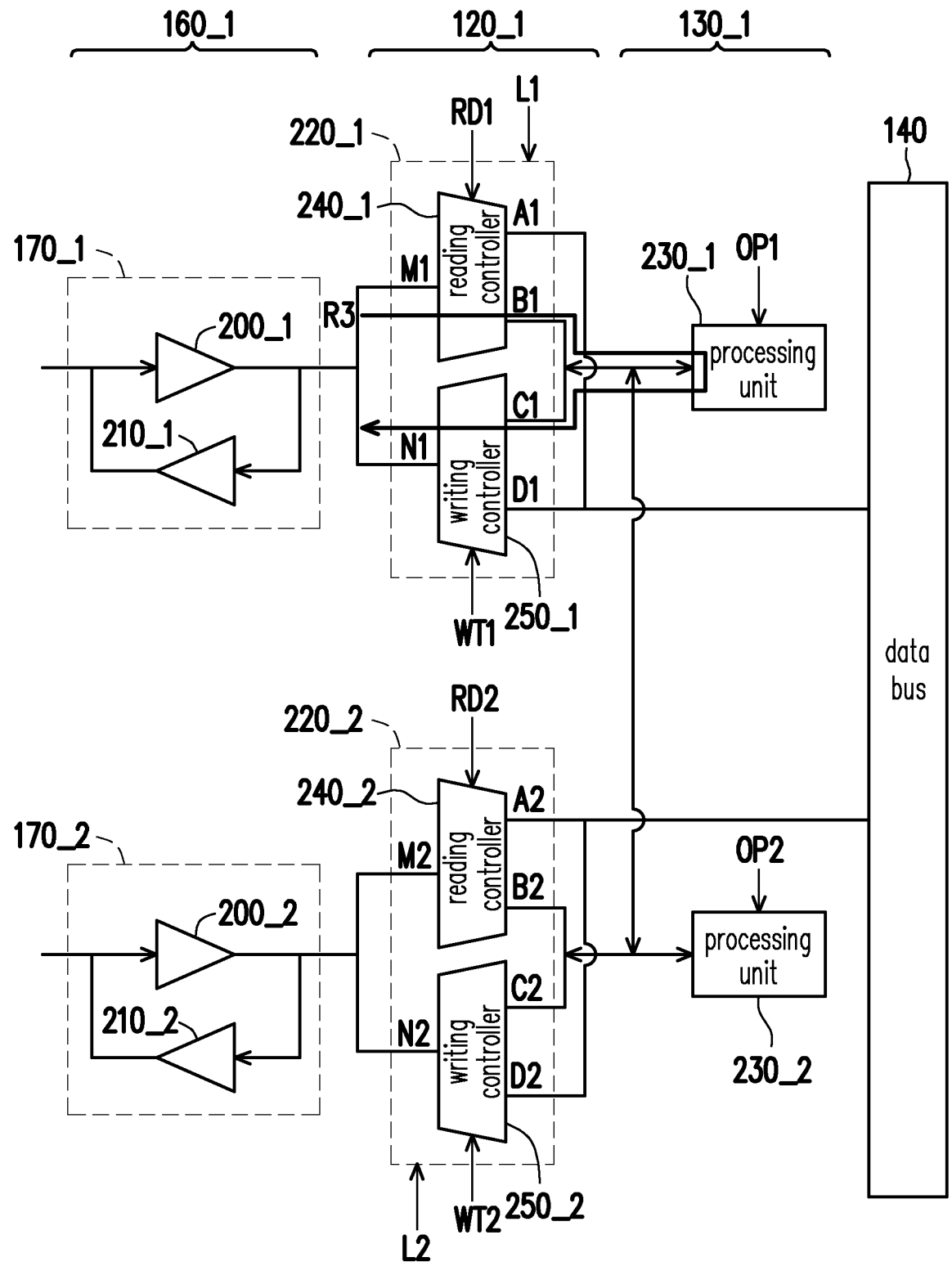

Referring to FIG. 3C, when the path control circuit 220_1 coupled to the memory block 170_1 receives the path control signal L1 with the second logic level (1), it represents that the memory apparatus is currently in the computation mode. According to Table 2, when the path control circuit 220_1 receives the reading signal RD1 with the second logic level (1) and the writing signal WT1 with the second logic level (1), the reading controller 240_1 selects the output terminal B1 and the writing controller 250_1 selects the input terminal C1. Meanwhile, the processing unit 230_1 may be enabled according to the operation enabling signal OP1, and a transmission path R3 for connecting the output terminal B1, the processing unit 230_1 and the input terminal C1 is established.

Accordingly, as shown in FIG. 3C, the reading controller 240_1 may read the first data Data1 from the memory block 170_1 to the enabled processing unit 230_1 for computation through the transmission path R3. Then, the writing controller 250_1 may write the computed first data Data1 from the processing unit 230_1 to the memory block 170_1 through the transmission path R3.

Figure 3D:
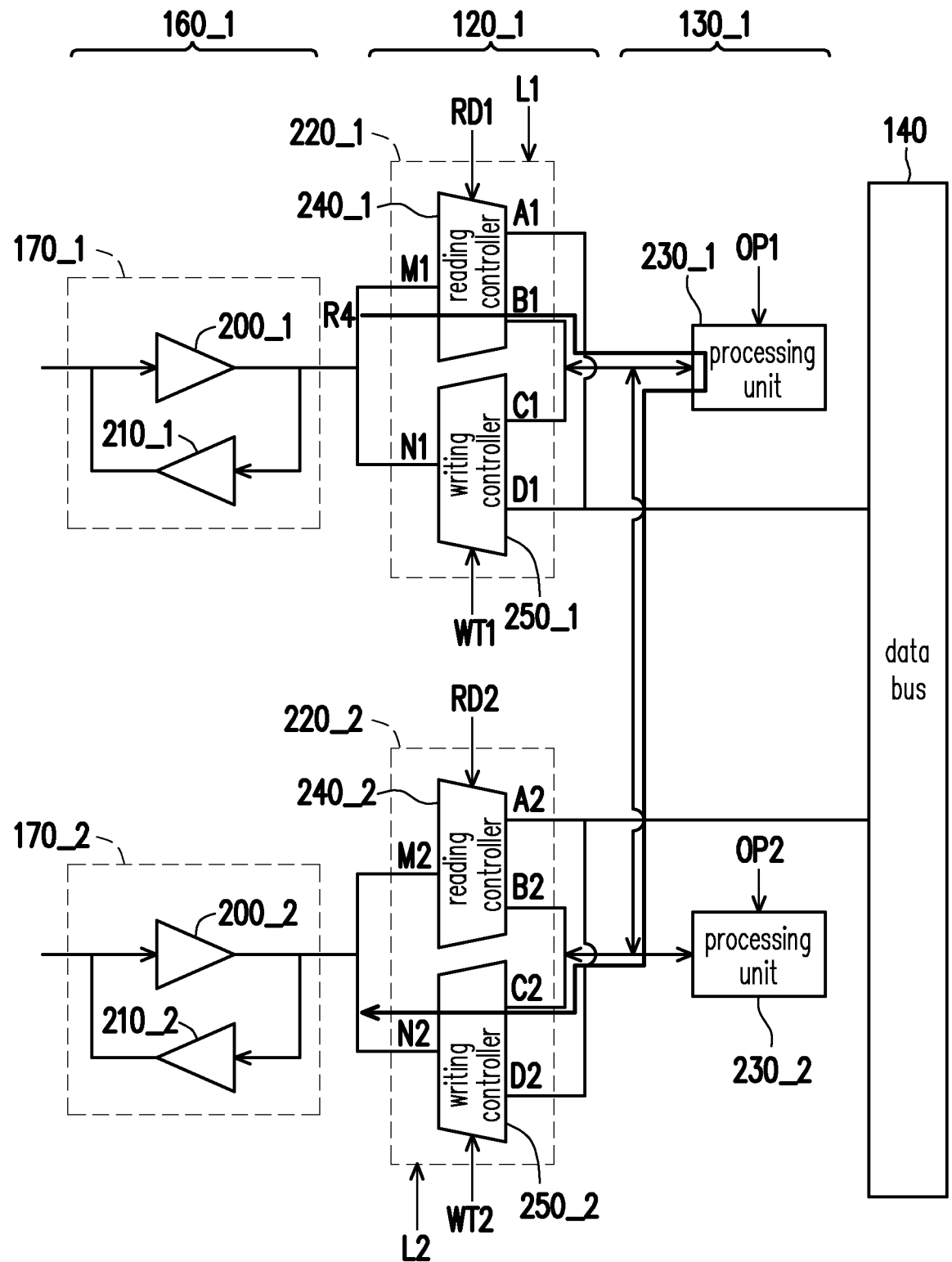

Referring to FIG. 3D, when the path control circuit 220_1 coupled to the memory block 170_1 and the path control circuit 220_2 coupled to the memory block 170_2 receive the path control signals L1 and L2 with the second logic level (1), respectively, it represents that the memory apparatus is currently in the computation mode. According to Table 2, when the path control circuit 220_1 receives the reading signal RD1 with the second logic level (1) and the writing signal WT1 with the first logic level (0), the reading controller 240_1 of the path control circuit 220_1 selects the output terminal B1; and when the path control circuit 220_2 receives the reading signal RD2 with the first logic level (0) and the writing signal WT1 with the second logic level (1), the writing controller 250_2 of the path control circuit 220_2 selects the input terminal C2. Meanwhile, the processing unit 230_1 may be enabled according to the operation enabling signal OP1, the processing unit 230_2 may be disabled according to the operation enabling signal OP2, and a transmission path R4 for connecting the output terminal B1, the processing unit 230_1 and the input terminal C2 is established.

Accordingly, as shown in FIG. 3D, the reading controller 240_1 of the path control circuit 220_1 may read the first data Data1 from the memory block 170_1 to the enabled processing unit 230_1 for computation through the transmission path R4. Then, the writing controller 250_2 of the path control circuit 220_2 may write the computed first data Data1 computed by the processing unit 230_1 to the memory block 170_2 through the transmission path R4.

Figure 3E:
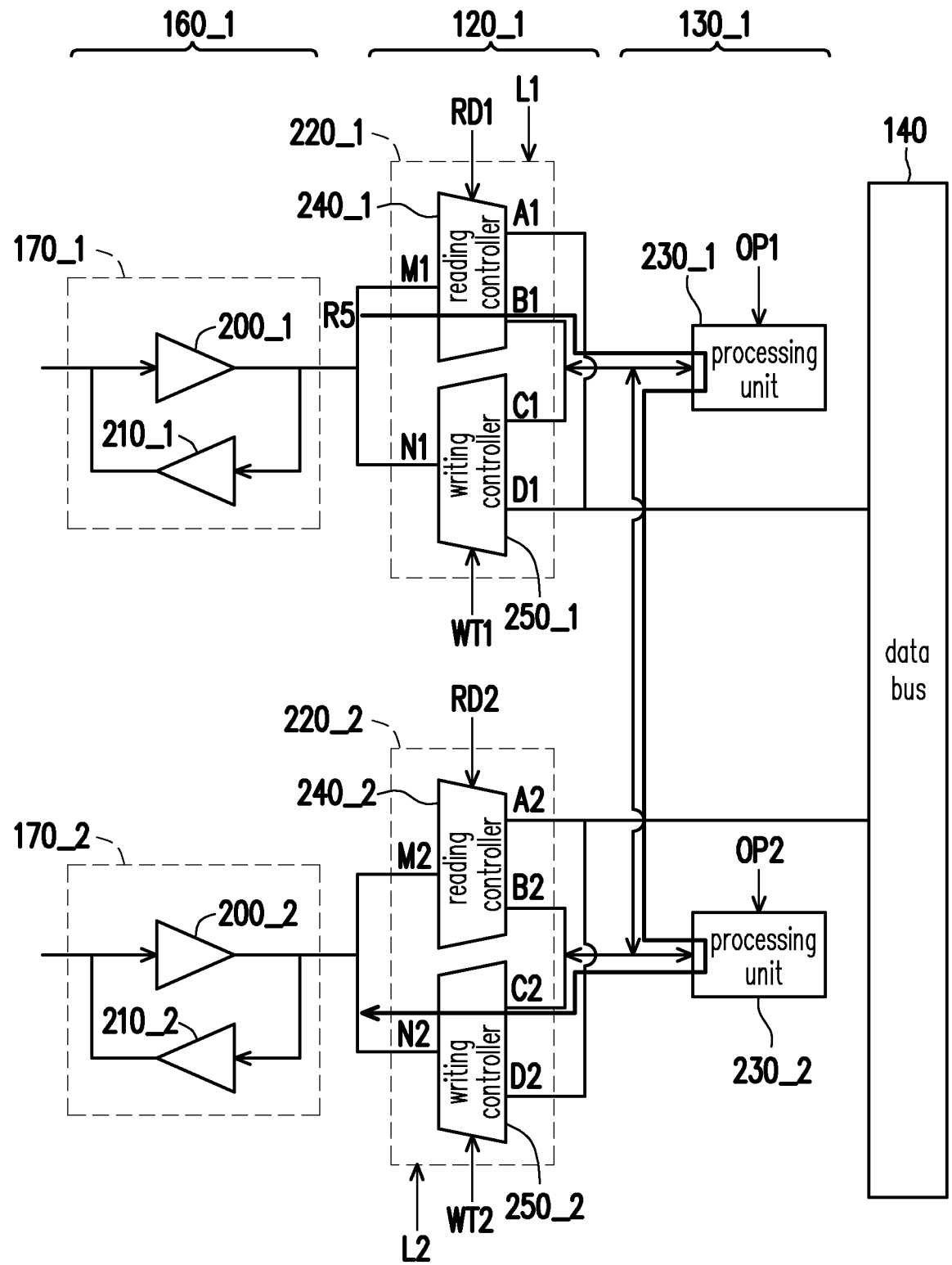

Referring to FIG. 3E, when the path control circuit 220_1 coupled to the memory block 170_1 and the path control circuit 220_2 coupled to the memory block 170_2 receive the path control signals L1 and L2 with the second logic level (1), respectively, it represents that the memory apparatus is currently in the computation mode. According to Table 2, when the path control circuit 220_1 receives the reading signal RD1 with the second logic level (1) and the writing signal WT1 with the first logic level (0), the reading controller 240_1 of the path control circuit 220_1 selects the output terminal B1; and when the path control circuit 220_2 receives the reading signal RD2 with the first logic level (0) and the writing signal WT1 with the second logic level (1), the writing controller 250_2 of the path control circuit 220_2 selects the input terminal C2. Meanwhile, the processing unit 230_1 may be enabled according to the operation enabling signal OP1, the processing unit 230_2 may be enabled according to the operation enabling signal OP2, and a transmission path R5 for connecting the output terminal B1, the processing units 230_1 and 230_2, and the input terminal C2 is established.

Accordingly, as shown in FIG. 3E, the reading controller 240_1 of the path control circuit 220_1 may read the first data Data1 from the memory block 170_1 to the enabled processing unit 230_1 for computation through the transmission path R5. Then, the processing unit 230_2 may receive the computed first data Data1 computed by the processing unit 230_1 and perform another computation on the received computed first data Data1 by the processing unit 230_2. Finally, the writing controller 250_2 of the path control circuit 220_2 may write the computed first data Data1 which is in sequence computed by the processing units 230_1 and 230_2 to the memory block 170_2.

Figure 4:
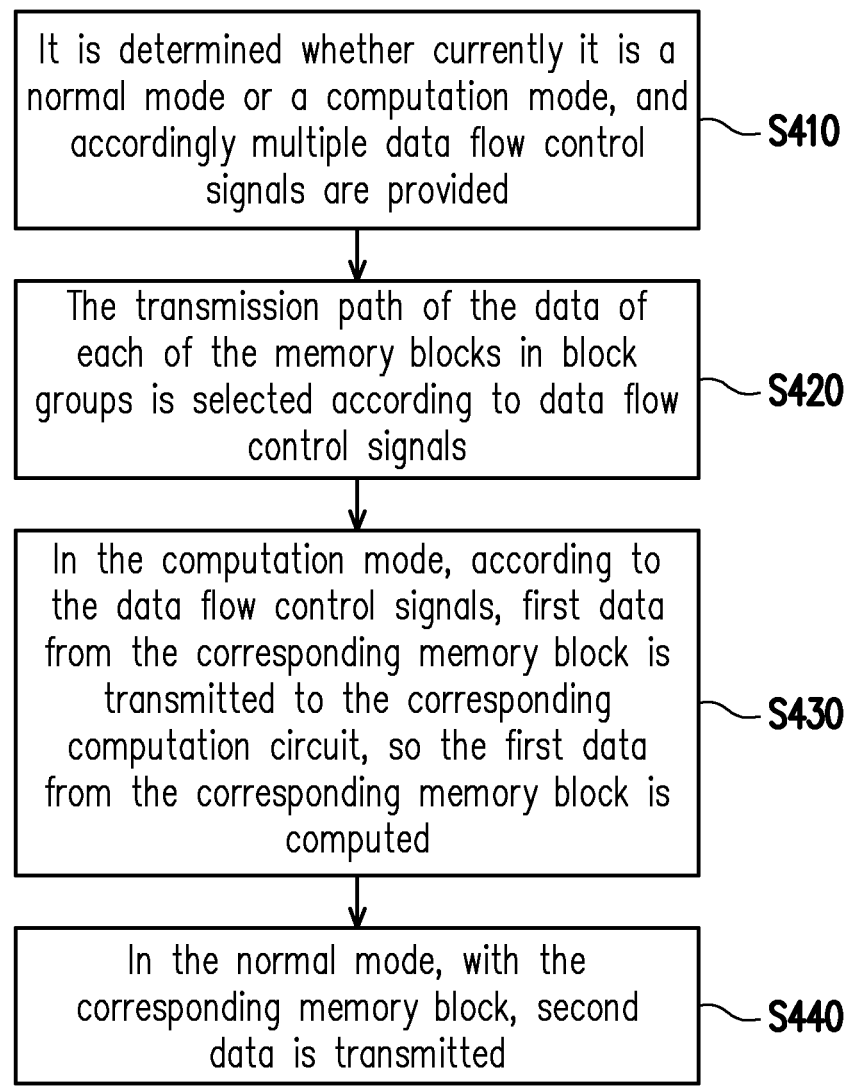
FIG. 4 is a flowchart illustrating an operation method of a memory apparatus according to an embodiment of the disclosure.

Referring to FIG. 4, the operation method of the memory apparatus in the embodiment includes the following steps. It is determined whether currently it is the normal mode or the computation mode, and accordingly multiple data flow signals are provided (step S410). Next, the transmission path of the data of each of the memory blocks in block groups respectively is selected according to data flow control signals (step S420). In the computation mode, according to the data flow control signals, first data from the corresponding memory block is transmitted to the corresponding computation circuit, so the first data from the corresponding memory block is computed (step S430). In the normal mode, second data is transmitted with the corresponding memory block (step S440). The sequence of the steps S410, S420, S430, and S440 is illustrated as an example, and the embodiment of the disclosure is not limited thereto. Moreover, for details of the steps S410, S420, and S430, refer to the embodiments in FIG. 1 and FIG. 3A to FIG. 3E, and the details are not iterated herein.

Based on the above, in the embodiments of the disclosure, the memory apparatus may make full use of the embedded processing unit to process a large number of operations in parallel, and the proper transmission path of the data may be determined according to its current mode (the normal mode or the computation mode). Accordingly, not only the time on the parallel and serial conversion and the time on the serial transmission may be saved, but it also makes it possible for different block groups to perform the required computations altogether, thereby improving the computing speed and reducing energy consumption.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. A memory apparatus embedded with a computing function, comprising:
    a memory array comprising a plurality of block groups, wherein each of the plurality of the block groups comprises a plurality of memory blocks;
    a plurality of data flow controllers respectively coupled to the plurality of the block groups and configured to respectively select transmission paths of data of the plurality of the memory blocks in the plurality of the block groups according to a plurality of data flow control signals;
    a plurality of computation circuits respectively coupled to the plurality of the data flow controllers and configured to compute a first data from the corresponding memory block in a computation mode;
    a data bus coupled to the plurality of the data flow controllers and transmitting a second data with the corresponding memory block in a normal mode; and
    a control logic circuit coupled to the memory array, the plurality of the data flow controllers, and the plurality of the computation circuits, the control logic circuit configured to determine whether the memory apparatus is currently in the normal mode or the computation mode, and accordingly provide the plurality of the data flow controllers with the plurality of the data flow control signals,
    wherein each of the plurality of the data flow controllers transmits the first data from the corresponding memory block to the corresponding computation circuit according to a corresponding data flow control signal to compute the first data,
    wherein each of the of the plurality of the data flow controllers is configured to electrically connect the corresponding memory block to the corresponding computation circuit and electrically disconnect the corresponding memory block from the data bus during the computation mode, and
    each of the plurality of the data flow controllers is configured to electrically disconnect the corresponding memory block from the corresponding computation circuit and electrically connect the corresponding memory block to the data bus during the normal mode.

2. The memory apparatus according to claim 1, wherein the control logic circuit comprises:
    a mode register configured to store a mode setting code, wherein the control logic circuit is configured to determine whether the memory apparatus is currently in the normal mode or the computation mode according to the mode setting code and accordingly provide the plurality of the data flow control signals.

3. The memory apparatus according to claim 2, wherein the mode register also stores a block computing code, and the control logic circuit determines which block group to compute the first data through the plurality of the computation circuits in the computation mode according to the block computing code.

4. The memory apparatus according to claim 1, wherein a parallel transmission of the first data is performed between the memory blocks and the corresponding computation circuits.

5. The memory apparatus according to claim 1, wherein each of the plurality of the computation circuits comprises:
    a plurality of processing units, wherein each of the plurality of the processing units is enabled according to a computation enabling signal to perform a multiply-accumulate operation parallelly on the first data from the corresponding memory blocks,
    wherein the plurality of the processing units disposed in one of the plurality of the computation circuits are coupled to one another.

6. The memory apparatus according to claim 5, wherein each of the plurality of the data flow controllers comprises a plurality of path control circuits, each of the plurality of the data flow control signals comprises a plurality of path control signals, and each of the plurality of the path control circuits comprises:
    a reading controller, wherein an input terminal of the reading controller is coupled to the corresponding memory block, a first output terminal of the reading controller is coupled to the data bus, a second output terminal of the reading controller is coupled to the corresponding processing unit, and the reading controller is configured to select either the first output terminal or the second output terminal of the reading controller to output the first data according to the corresponding path control signal; and
    a writing controller, wherein a first input terminal of the writing controller is coupled to the corresponding processing unit, a second input terminal of the writing controller is coupled to the data bus, an output terminal of the writing controller is coupled to the corresponding memory block, and the writing controller is configured to either obtain the computed first data from the first input terminal of the writing controller or obtain the second data from the second input terminal of the writing controller according to the corresponding path control signal.

7. The memory apparatus according to claim 6, wherein in the normal mode, when the path control circuit receives the path control signal with a first logic level, a reading signal with a second logic level, and a writing signal with the first logic level, the reading controller of the path control circuit reads the second data from the corresponding memory block to the data bus; and
    wherein in the normal mode, when the path control circuit receives the path control signal with the first logic level, the reading signal with the first logic level, and the writing signal with the second logic level, the writing controller of the path control circuit writes the second data from the data bus to the memory block.

8. The memory apparatus according to claim 6, wherein in the computation mode, when the path control circuit receives the path control signal with a second logic level, a reading signal with the second logic level, and a writing signal with the second logic level, the reading controller of the path control circuit reads the first data from the corresponding memory block to the enabled processing unit to perform computations, and the writing controller of the path control circuit writes the computed first data from the processing unit to the corresponding memory block.

9. The memory apparatus according to claim 6, wherein the plurality of the memory blocks comprise a first memory block and a second memory block; the plurality of the path control circuits comprise a first path control circuit coupled to the first memory block and a second path control circuit coupled to the second memory block; the plurality of the processing units comprise a first processing unit coupled to the first path control circuit and a second processing unit coupled to the second path control circuit; and in the computation mode, when the first path control circuit receives the path control signal with a second logic level, a first reading signal with the second logic level, and a first writing signal with a first logic level and when the first processing unit is enabled, the first path control circuit reads the first data from the first memory block to the enabled first processing unit to perform computations on the read first data, and when the second path control circuit receives the path control signal with the second logic level, a second reading signal with the first logic level, and a second writing signal with the second logic level and when the second processing unit is not enabled, the second path control circuit writes the computed first data computed by the first processing unit to the second memory block.

10. The memory apparatus according to claim 6, wherein the plurality of the memory blocks comprise a first memory block and a second memory block; the plurality of the path control circuits comprise a first path control circuit coupled to the first memory block and a second path control circuit coupled to the second memory block; the plurality of the processing units comprise a first processing unit coupled to the first path control circuit and a second processing unit coupled to the second path control circuit; and in the computation mode, when the first path control circuit receives the path control signal with a second logic level, a first reading signal with the second logic level, and a first writing signal with a first logic level and when the first processing unit is enabled, the first path control circuit reads the first data from the first memory block to the enabled first processing unit to perform computations on the read first data, and when the second path control circuit receives the path control signal with the second logic level, a second reading signal with the first logic level, and a second writing signal with the second logic level signal and when the second processing unit is also enabled, the second processing unit receives the computed first data computed by the first processing unit and performs another computations on the computed first data, and the second path control circuit writes the computed first data which is in sequence computed by the first processing unit and the second processing unit to the second memory block.

11. An operation method of a memory apparatus adapted for a memory apparatus comprising a plurality of block groups and a plurality of computation circuits, wherein each of the plurality of the block groups comprises a plurality of memory blocks, and the operation method comprises following steps:

determining whether the memory apparatus is currently in a normal mode or a computation mode, and accordingly providing a plurality of data flow controllers respectively coupled to the plurality of the block groups with a plurality of data flow control signals;

selecting transmission paths of data of the plurality of the memory blocks of the plurality of the block groups respectively through the plurality of the data flow controllers according to the plurality of the data flow control signals;

in a computation mode, according to a data flow control signal, the corresponding memory block is electrically connected to the corresponding computation circuit and the corresponding memory block is electrically disconnected from the data bus during the computation mode, a first data from the corresponding memory block is transmitted to the corresponding computation circuit, so that the corresponding computation circuit computes the first data from the corresponding memory block; and transmitting a second data between a data bus and the corresponding memory block in a normal mode, wherein the corresponding memory block is electrically disconnected from the corresponding computation circuit and the corresponding memory block is electrically connected to the data bus during the normal mode.

12. The operation method of the memory apparatus according to claim 11, further comprising:
storing a mode setting code,
wherein the step of determining whether the memory apparatus is currently in the normal mode or the computation mode, and accordingly providing the plurality of the data flow controllers comprises:
determining whether the memory apparatus is currently in the normal mode or the computation mode according to the mode setting code, and accordingly providing the plurality of the data flow control signals.

13. The operation method of the memory apparatus according to claim 11, further comprising:
storing a block computing code; and
determining which block group computes the first data through the plurality of the computation circuits in the computation mode according to the block computing code.

14. The operation method of the memory apparatus according to claim 11, wherein a parallel transmission of the first data is performed between the memory blocks and the corresponding computation circuits.

15. The operation method of the memory apparatus according to claim 11, wherein each of the plurality of the computation circuits comprises a plurality of processing units coupled to one another, and the operation method further comprises:
performing a multiply-accumulate operation parallelly on the first data from the corresponding memory blocks through the processing units according to a computation enabling signal.

16. The operation method of the memory apparatus according to claim 15, wherein the step of transmitting the second data with the corresponding memory block in the normal mode comprises:
reading the second data from the corresponding memory block to the data bus when receiving the path control signal with a first logic level, a reading signal with a second logic level, and a writing signal with the first logic level in the normal mode, and writing the second data from the data bus to the memory block when receiving the path control signal with the first logic level, the reading signal with the first logic level, and the writing signal with the second logic level in the normal mode.

17. The operation method of the memory apparatus according to claim 15, wherein the step in which in the computation mode, according to the data flow control signal, the first data from the corresponding memory block is transmitted to the corresponding computation circuit, so that the corresponding computation circuit computes the first data from the corresponding memory block comprises:
  in the computation mode, reading the first data from the corresponding memory block to the enabled processing unit to perform computations when receiving the path control signal with a second logic level, a reading signal with the second logic level, and a writing signal with the second logic level, and writing the computed first data from the processing unit to the corresponding memory block.

18. The operation method of the memory apparatus according to claim 15, wherein the step in which the plurality of the memory blocks comprise a first memory block and a second memory block, the plurality of the processing units comprise a first processing unit and a second processing unit, and in the computation mode, according to the data flow control signal, the first data from the corresponding memory block is transmitted to the corresponding computation circuit, so that the corresponding computation circuit computes the first data from the corresponding memory block comprises:
  in the computation mode, reading the first data from the first memory block to the enabled first processing unit to perform computations when receiving the path control signal with a second logic level, a first reading signal with the second logic level, and a first writing signal with a first logic level and when the first processing unit is enabled; and
  writing the computed first data computed by the first processing unit to the second memory block when receiving the path control signal with the second logic level, a second reading signal with the first logic level, and a second writing signal with the second logic level and when the second processing unit is not enabled.

19. The operation method of the memory apparatus according to claim 15, wherein the step in which the plurality of the memory blocks comprise a first memory block and a second memory block, the plurality of the processing units comprise a first processing unit and a second processing unit, and in the computation mode, according to the data flow control signal, the first data from the corresponding memory block is transmitted to the corresponding computation circuit, so that the corresponding computation circuit computes the first data from the corresponding memory block comprises:
  in the computation mode, reading the first data from the first memory block to the enabled first processing unit to perform computations on the read first data when receiving the path control signal with a second logic level, a first reading signal with the second logic level, and a first writing signal with a first logic level and when the first processing unit is enabled; and
  receiving the computed first data computed by the first processing unit through the second processing unit and performing another computations on the computed first data when receiving the path control signal with the second logic level, a second reading signal with the first logic level, and a second writing signal with the second logic level signal and when the second processing unit is also enabled, and writing the computed first data which is in sequence computed by the first processing unit and the second processing unit to the second memory block.

* * * * *